(12) United States Patent
Narukawa et al.

(10) Patent No.: US 11,316,018 B2
(45) Date of Patent: Apr. 26, 2022

(54) COMPOUND SEMICONDUCTOR SUBSTRATE INCLUDING ELECTRON TRANSITION LAYER AND BARRIER LAYER

(71) Applicant: AIR WATER INC., Sapporo (JP)

(72) Inventors: Mitsuhisa Narukawa, Matsumoto (JP); Sumito Ouchi, Matsumoto (JP); Hiroki Suzuki, Matsumoto (JP); Keisuke Kawamura, Matsumoto (JP)

(73) Assignee: Air Water Inc., Sapporo (JP)

( * ) Notice: Subject to any disclaimer, the term of this patent is extended or adjusted under 35 U.S.C. 154(b) by 99 days.

(21) Appl. No.: 16/497,714

(22) PCT Filed: Mar. 7, 2018

(86) PCT No.: PCT/JP2018/008802
§ 371 (c)(1),
(2) Date: Sep. 25, 2019

(87) PCT Pub. No.: WO2018/180312
PCT Pub. Date: Oct. 4, 2018

(65) Prior Publication Data
US 2020/0020778 A1    Jan. 16, 2020

(30) Foreign Application Priority Data
Mar. 31, 2017   (JP) .............................. JP2017-071662

(51) Int. Cl.
*H01L 29/267*   (2006.01)
*H01L 21/02*   (2006.01)
(Continued)

(52) U.S. Cl.
CPC ........ *H01L 29/267* (2013.01); *H01L 21/0254* (2013.01); *H01L 21/02381* (2013.01);
(Continued)

(58) Field of Classification Search
CPC ............ H01L 29/267; H01L 21/02381; H01L 21/02447; H01L 21/02458; H01L 21/02505; H01L 21/0254
(Continued)

(56) References Cited

U.S. PATENT DOCUMENTS

| 8,324,005 | B2 | 12/2012 | Saxler et al. |
| 2013/0069076 | A1* | 3/2013 | Iwami ............... H01L 21/02381 |
| | | | 257/76 |

(Continued)

FOREIGN PATENT DOCUMENTS

| CN | 104054166 A | 9/2014 |
| JP | 2008-171843 A | 7/2008 |

(Continued)

OTHER PUBLICATIONS

Fang, H. et al., "Interaction of the dual effects triggered by AlN interlayers in thick GaN grown on 3C-SiC/Si substrates", Journal of Physics D: Applied Physics, Sep. 4, 2012, vol. 45, No. 38, Institute of Physics Publishing Ltd., GB.

(Continued)

*Primary Examiner* — Matthew E. Gordon
(74) *Attorney, Agent, or Firm* — Wood, Phillips, Katz, Clark & Mortimer (57) ABSTRACT

A compound semiconductor substrate includes a SiC (silicon carbide) layer, a AlN (aluminum nitride) buffer layer formed on the SiC layer, an Al (aluminum) nitride semiconductor layer formed on the AlN buffer layer, a composite layer formed on the Al nitride semiconductor layer, a GaN (gallium nitride) layer as an electron transition layer formed on the composite layer, and an Al nitride semiconductor layer as a barrier layer formed on the GaN layer. The (Continued)

composite layer includes C—GaN layers stacked in a vertical direction, and an AlN layer formed between the C—GaN layers.

7 Claims, 8 Drawing Sheets

(51) Int. Cl.
    *H01L 29/16*     (2006.01)
    *H01L 29/20*     (2006.01)
    *H01L 29/778*     (2006.01)

(52) U.S. Cl.
    CPC .. *H01L 21/02447* (2013.01); *H01L 21/02458* (2013.01); *H01L 21/02505* (2013.01); *H01L 21/0262* (2013.01); *H01L 29/1608* (2013.01); *H01L 29/2003* (2013.01); *H01L 29/778* (2013.01)

(58) Field of Classification Search
    USPC .......................................................... 257/77
    See application file for complete search history.

(56) References Cited

U.S. PATENT DOCUMENTS

| | | | |
|---|---|---|---|
| 2014/0091314 A1* | 4/2014 | Ishiguro | H01L 29/7787 257/76 |
| 2014/0353587 A1 | 12/2014 | Hoteida et al. | |
| 2016/0240679 A1* | 8/2016 | Chen | H01L 29/205 |
| 2016/0293710 A1 | 10/2016 | Omori et al. | |
| 2017/0133217 A1 | 5/2017 | Sato et al. | |
| 2018/0053647 A1 | 2/2018 | Fukazawa et al. | |

FOREIGN PATENT DOCUMENTS

| | | |
|---|---|---|
| JP | 2010-521065 A | 6/2010 |
| JP | 2013-145782 A | 7/2013 |
| JP | 2013-145821 A | 7/2013 |
| JP | 2013-179121 A | 9/2013 |
| JP | 2014-072431 A | 4/2014 |
| JP | 2015-201574 A | 11/2015 |
| TW | 201413948 A | 4/2014 |
| TW | 201707063 A | 2/2017 |

OTHER PUBLICATIONS

Supplementary European Search Report, dated Mar. 17, 2020 in European Patent Application No. EP 18776359.
Office Action dated Jul. 21, 2020 in Japanese Patent Application No. 2017-071662.
Office Action dated Jun. 21, 2021 in Taiwan Patent Application No. 107108976.
International Preliminary Report on Patentability and Written Opinion of the International Searching Authority, dated Oct. 10, 2019 in International Patent Application No. PCT/JP2018/008802.
International Search Report dated May 22, 2018 in International Patent Application No. PCT/JP2018/008802.
Office Action dated Nov. 5, 2021 in European Patent Application 18 776 359.4.

* cited by examiner

| SAMPLES | INVENTION 1 | INVENTION 2 | COMPARATIVE |
|---|---|---|---|
| C-GaN LAYER C CONCENTRATION | $1\sim2\times10^{19}$ATOMS/cm$^3$ | $1\sim2\times10^{19}$ATOMS/cm$^3$ | $1\sim2\times10^{19}$ATOMS/cm$^3$ |
| CRACKS | NONE | NONE | EXIST |
| WARPAGE | CONCAVE 43 μm | CONVEX 27 μm | CONCAVE 146 μm |
| VERTICAL WITHSTAND VOLTAGE ($\times10^{-6}$A/mm$^2$) (COMPARATIVE EXAMPLE AS ZERO) | +60V | +85V | 0 |

FIG. 8

COMPOUND SEMICONDUCTOR SUBSTRATE INCLUDING ELECTRON TRANSITION LAYER AND BARRIER LAYER

TECHNOLOGICAL FIELD

The present invention relates to a compound semiconductor substrate. More particularly, the invention relates to a compound semiconductor substrate with a SiC (silicon carbide) layer.

DESCRIPTION OF THE RELATED ART

GaN (gallium nitride) has a larger band gap than Si (silicon). GaN (gallium nitride) is known as a wide band gap semiconductor material, with high isolation breakdown field strength.

As compared to other wide band gap semiconductor materials, GaN has high insulation breakdown resistance. Therefore, GaN is expected to be applied to next-generation low-loss power devices.

When a Si substrate is used as a start substrate (foundation substrate) of a semiconductor device using GaN, a phenomenon in that warpage occurs in the substrate or cracks occur in the GaN layer is likely to occur, due to the large difference in lattice constants and thermal expansion coefficients between GaN and Si.

As a countermeasure to the warpage of the substrate or the occurrence of cracks into the GaN layer, for example, a semiconductor substrate is disclosed in the following Patent Document 1, etc. The semiconductor substrate comprises a Si substrate, a 3C—SiC layer formed on the Si substrate, and a plurality of AlN (aluminum nitride) layers and GaN layers alternately formed.

A conventional semiconductor substrate having a GaN layer is also disclosed in the following Patent Documents 2 and 3, etc. Patent Document 2 below discloses a semiconductor structure. The semiconductor structure comprises a substrate consisting of SiC, a nucleation layer consisting of AlN formed on the substrate, a graded layer consisting of AlGaN (aluminum gallium nitride) formed on the nucleation layer, and a nitride layer consisting of GaN formed on the graded layer.

Patent Document 3 below discloses a semiconductor substrate. The semiconductor substrate has a substrate, a buffer layer on the substrate, a high resistance layer consisting of a nitride semiconductors on the buffer layer, including transition metal and carbon, and a channel layer consisting of a nitride semiconductor on the high resistance layer. The high resistance layer has a decreasing layer. The decreasing layer is in contact with the channel layer. In the decreasing layer, the concentration of transition metal decreases from the buffer layer side toward the channel layer side. The decreasing rate at which the carbon concentration decreases towards the channel layer is greater than the decreasing rate at which the transition metal concentration decreases towards the channel layer.

PRIOR ART DOCUMENT DOCUMENT(S) RELATED TO PATENTS

[Patent Document 1] Japanese Unexamined Patent Application Publication No. 2013-179121
[Patent Document 2] Japanese Translation of PCT International Application Publication No. 2010-521065
[Patent Document 3] Japanese Unexamined Patent Application Publication No. 2015-201574

SUMMARY OF THE INVENTION

Problems to be Resolved by the Invention

According to the technology disclosed in Patent Document 1 or the like, the occurrence of the warpage of the substrate or clacks into the GaN layer can be suppressed to some extent, and a GaN layer with relatively good crystal quality can be obtained. On the other hand, according to the technology of Patent Document 1 etc., there is a limit to increasing the thickness of the GaN layer, and there is a limit to withstand voltage as well. This is because when a GaN layer is thickened, warpage occurs in substrate and cracks are generated in the GaN layer. Considering the use of GaN as a power device, it is important to improve withstand voltage of semiconductor devices using GaN.

The present invention is to solve the above-mentioned problems, and its object is to provide a compound semiconductor substrate having a desired quality.

Means to Solve the Problem

A compound semiconductor substrate according to one aspect of this invention comprises: a SiC layer, a buffer layer consisting of AlN formed on the SiC layer, a nitride semiconductor layer containing Al formed on the buffer layer, a composite layer formed on the nitride semiconductor layer, an electron transition layer consisting of GaN formed on the composite layer, and a barrier layer formed on the electron transition layer, wherein the composite layer includes a plurality of first layers being stacked in a vertical direction, consisting of GaN including carbon, and a second layer consisting of AlN formed between the plurality of the first layers.

Preferably, according to the above-mentioned compound semiconductor substrate, each of the plurality of the first layers has an average carbon atomic concentration of $1*10^{18}$ atoms/cm$^3$ or more and $1*10^{21}$ atoms/cm$^3$ or less.

Preferably, according to the above-mentioned compound semiconductor substrate, the second layer has a thickness of 10 nanometers or more and 15 nanometers or less.

Preferably, according to the above-mentioned compound semiconductor substrate, the first layer has a thickness of 550 nanometers or more and 2000 nanometers or less.

Preferably, according to the above-mentioned compound semiconductor substrate, the compositional ratio of Al inside the nitride semiconductor layer decreases from a bottom to a top.

Preferably, according to the above-mentioned compound semiconductor substrate, the nitride semiconductor layer includes a first nitride semiconductor layer including Al and Ga, a second nitride semiconductor layer containing Al formed on the first nitride semiconductor layer, being in contact with the first nitride semiconductor layer, and a third nitride semiconductor layer including Al and Ga formed on the second nitride semiconductor layer, being in contact with the second nitride semiconductor layer, wherein the compositional ratio of Al inside at least one of the first and the third nitride semiconductor layers decreases from a bottom to a top.

Preferably, according to the above-mentioned compound semiconductor substrate, a first layer formed on the second layer among the plurality of the first layers includes compressive strain.

Preferably, according to the above-mentioned compound semiconductor substrate, the nitride semiconductor layer has a thickness of 900 nanometers or more and 2 micrometers or less.

Effect of the Invention

According to the present invention, a compound semiconductor substrate having desired quality can be provided.

DETAILED DESCRIPTION OF EMBODIMENTS

Hereinafter, embodiments of the present invention will be described based on the drawings.

First Embodiment

Figure 1:
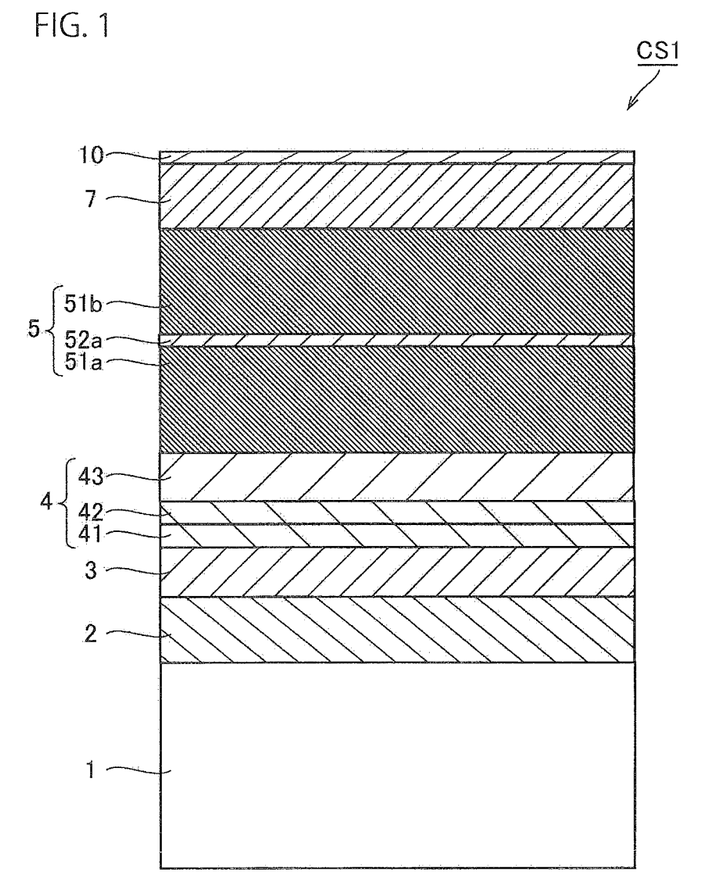
FIG. 1 is a cross-sectional view showing the configuration of compound semiconductor substrate CS1 in the first embodiment of the present invention.

FIG. 1 is a cross-sectional view showing the configuration of compound semiconductor substrate CS1 in the first embodiment of the present invention.

Referring to FIG. 1, the compound semiconductor substrate CS1 in the present embodiment includes a HEMT (High Electron Mobility Transistor). The compound semiconductor substrate CS1 has Si substrate 1, SiC layer 2, AlN buffer layer 3 (an example of a buffer layer consisting of AlN), Al nitride semiconductor layer 4 (an example of a nitride semiconductor layer including Al), composite layer 5, GaN layer 7 (an example of an electron transition layer), and Al nitride semiconductor layer 10 (an example of a barrier layer).

Si substrate 1 is made of, for example, p+-type Si. The (111) plane is exposed on the surface of Si substrate 1. Note that Si substrate 1 may have n-type conductivity. Si substrate 1 may be semi-insulating. The (100) plane or the (110) plane may be exposed on the surface of the Si substrate 1. Si substrate 1 has, for example, a diameter of 6 inches and has a thickness of 900 micrometers.

SiC layer 2 is in contact with Si substrate 1 and is formed on Si substrate 1. The SiC layer 2 is made of 3C—SiC, 4H—SiC, 6H—SiC, or the like. In particular, if SiC layer 2 was epitaxially grown on Si substrate 1, generally, SiC layer 2 consists of 3C—SiC.

The SiC layer 2 may be formed on a foundation layer consisting of SiC obtained by carbonizing of the surface of Si substrate 1, by using a MBE (Molecular Beam Epitaxy) method, a CVD (Chemical Vapor Deposition) method, a LPE (Liquid Phase Epitaxy) method, etc., by homo epitaxial growth of SiC. SiC layer 2 may be formed only by carbonizing the surface of Si substrate 1. Furthermore, SiC layer 2 may be formed by hetero epitaxial growth on the surface of Si substrate 1 (or with a buffer layer interposed). The SiC layer 2 is doped with, for example, N (nitrogen) etc., and has n-type conductivity. The SiC layer 2 has a thickness of, for example, 0.1 micrometer or more and 3.5 micrometer or less. The SiC layer 2 may have p-type conductivity. The SiC layer 2 may be semi-insulating.

AlN buffer layer 3 is in contact with SiC layer 2 and is formed on SiC layer 2. AlN buffer layer 3 functions as a buffer layer. The buffer layer mitigates the difference of lattice constants between SiC layer 2 and Al nitride semiconductor layer 4. AlN buffer layer 3 is formed, for example, by using MOCVD (Metal Organic Chemical Vapor Deposition) method. For example, growth temperature of AlN buffer layer 3 is set to 1000 degrees Celsius or more and 1300 degrees Celsius or less. At this time, as Al source gas, for example, TMA (Tri Methyl Aluminum), TEA (Tri Ethyl Aluminum), etc. are used. As N source gas, for example, $NH_3$ (ammonia) is used. AlN buffer layer 3 has a thickness of, for example, 100 nanometers or more and 1000 nanometers or less.

Al nitride semiconductor layer 4 is in contact with AlN buffer layer 3 and is formed on AlN buffer layer 3. Al nitride semiconductor layer 4 is made of nitride semiconductor containing Al, and is made of, for example, a material represented by $Al_xGa_{1-x}N$ ($0<x\leq1$). Also, Al nitride semiconductor layer 4 may be made of a material represented by $Al_xIn_yGa_{1-x-y}N$ ($0\leq x\leq1$, $0\leq y<1$). Al nitride semiconductor layer 4 acts as a buffer layer. The buffer layer mitigates the difference of lattice constants between AlN buffer layer 3 and C—GaN layer 51a in composite layer 5. Al nitride semiconductor layer 4 has a thickness of, for example, 500 nanometers or more and 2 micrometers or less. Al nitride semiconductor layer 4 preferably has a thickness of 900 nanometers or more and 2 micrometers or less. Al nitride semiconductor layer 4 is formed, for example, by using the MOCVD method.

Composite layer 5 is in contact with Al nitride semiconductor layer 4 and is formed on Al nitride semiconductor layer 4. Composite layer 5 includes multiple C—GaN layers stacked in the vertical direction (the same direction as the stacking direction of Si substrate 1, SiC layer 2, the AlN buffer layer, and Al nitride semiconductor layer 4, as the vertical direction in FIG. 1), and an AlN layer formed between each of multiple C—GaN layers. In other words, composite layer 5 has a configuration in which a C—GaN layer and an AlN layer are alternately stacked one or more times. The top and bottom layers of composite layer 5 are both C—GaN layers. The C—GaN layer is a GaN layer (C-doped GaN layer) containing C (carbon). C plays a role in enhancing the insulation of the GaN layer.

The number of C—GaN layers constituting composite layer 5 may be two or more. The number of AlN layers that constitutes composite layer 5 is also arbitrary. As a C—GaN layer, the composite layer 5 of the present embodiment includes two C—GaN layers 51a and 51b (an example of a plurality of first layers), and one AlN layer 52a (an example of a second layer). The C—GaN layer 51a is the lowermost layer among the layers constituting the composite layer 5. The C—GaN layer 51a is in contact with Al nitride semiconductor layer 4. The C—GaN layer 51b is the uppermost layer among the layers constituting the composite layer 5. The C—GaN layer 51b is in contact with the GaN layer 7. The AlN layer 52a is formed between the C—GaN layer 51a and the C—GaN layer 51b.

Each of a plurality of C—GaN layers (in the present embodiment, C—GaN layers 51a and 51b) constituting composite layer 5 has, for example, an average carbon atomic concentration of $1\times10^{18}/cm^3$ or more and $1\times10^{21}/cm^3$ or less. Preferably, it has an average carbon concentration of $3\times10^{18}/cm^3$ or more and $2\times10^{19}/cm^3$. Each of the plurality of GaN layers that constitutes the composite layer 5 may have the same average carbon atomic concentration. They may have different average carbon atomic concentrations from one another.

In addition, each of the plurality of C—GaN layers constituting composite layer 5 has a thickness of, for example, 550 nanometers or more and 2000 nanometers or less. It preferably has a thickness of 800 nanometers or more and 1500 nanometers or less. The plurality of C—GaN layers constituting the composite layer 5 may have the same thickness. They may have different thicknesses from one another.

The AlN layer (AlN layer 52a in this embodiment) constituting composite layer 5 has a thickness of, for example, 10 nanometers or more and 15 nanometers or less. When there are multiple AlN layers that compose composite layer 5, the AlN layers that constitute the composite layer 5 may have the same thickness. They may have different thicknesses.

The C—GaN layers 51a and 51b constituting the composite layer 5 are formed, for example, by using the MOCVD method. At this time, as Ga source gas, for example, TMG (Tri Methyl Gallium) or TEG (Tri Ethyl Gallium) is used. As N source gas, for example, $NH_3$ is used. The AlN layers constituting the composite layer 5 are formed in the same way as the AlN buffer layer 3.

When forming the C—GaN layers 51a and 51b, C can be doped into the GaN layer by adopting GaN growth conditions such that C contained in TMG is incorporated into the GaN layer. Specific methods for doping C in the GaN layer include lowering the growth temperature of GaN, reducing the growth pressure of GaN, increasing the molar flow rate of TMG to $NH_3$, and so on.

Note that another layer such as an undoped GaN layer may be interposed between the Al nitride semiconductor layer 4 and the composite layer 5.

The GaN layer 7 is in contact with the composite layer 5. It is formed on the composite layer 5. The GaN layer 7 is undoped and semi-insulating. The GaN layer 7 becomes an electron transition layer of the HEMT. The GaN layer 7 has a thickness of, for example, 100 nanometers or more and 1000 nanometers or less. The GaN layer 7 is formed, for example, by using the MOCVD method. At this time, as Ga source gas, for example, TMG or TEG is used. As N source gas, for example, $NH_3$ is used.

Al nitride semiconductor layer 10 is in contact with the GaN layer 7. It is formed on the GaN layer 7. Al nitride semiconductor layer 10 is made of nitride semiconductor containing Al. It is made of, for example, a material represented by $Al_xGa_{1-x}N$ ($0<x\leq1$). Further, Al nitride semiconductor layer 10 may be made of a material represented by $Al_xIn_yGa_{1-x-y}N$ ($0<x\leq1$, $0\leq y<1$). Al nitride semiconductor layer 10 is a barrier layer of HEMT. Al nitride semiconductor layer 10 has, for example, a thickness of 10 nanometers to 50 nanometers. Al nitride semiconductor layer 10 is formed in the same manner as Al nitride semiconductor layer 4.

Figure 2:
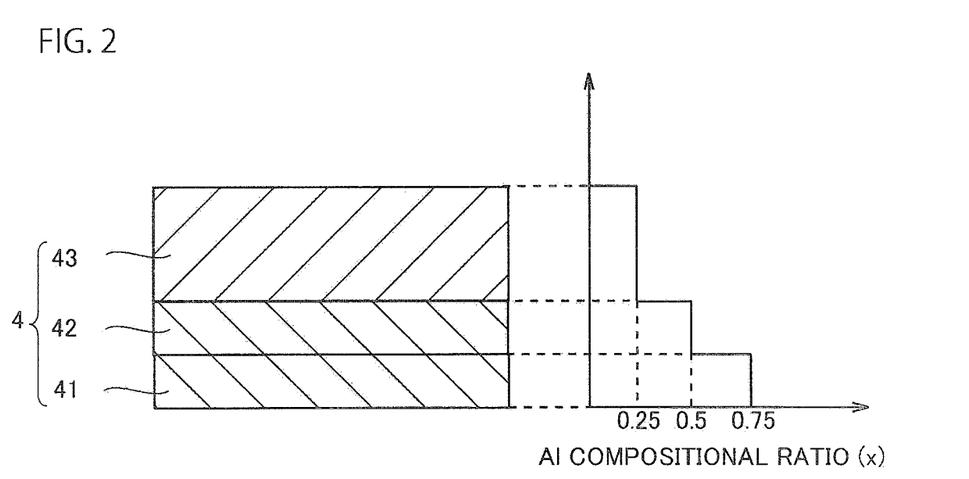
FIG. 2 is a view showing a distribution of Al compositional ratio inside Al nitride semiconductor layer 4 in the first embodiment of the present invention.

FIG. 2 shows the distribution of Al compositional ratio inside Al nitride semiconductor layer 4 in the first embodiment of the present invention.

Referring to FIG. 2, the compositional ratio of Al inside Al nitride semiconductor layer 4 decreases from the bottom to the top. Al nitride semiconductor layer 4 includes $Al_{0.75}Ga_{0.25}N$ layer 41 (an AlGaN layer with compositional ratio of Al is 0.75), $Al_{0.5}Ga_{0.5}N$ layer 42 (an AlGaN layer with compositional ratio of Al is 0.5), and $Al_{0.25}Ga_{0.75}N$ layer 43 (an AlGaN layer with compositional ratio of Al is 0.25). The $Al_{0.75}Ga_{0.25}N$ layer 41 is formed on the AlN buffer layer 3, being in contact with the AlN buffer layer 3. The $Al_{0.5}Ga_{0.5}N$ layer 42 is formed on the $Al_{0.5}Ga_{0.25}N$ layer 41, being in contact with the $Al_{0.75}Ga_{0.25}N$ layer 41. The $Al_{0.25}Ga_{0.75}N$ layer 43 is formed on the $Al_{0.5}Ga_{0.5}N$ layer 42, being in contact with the $Al_{0.5}Ga_{0.5}N$ layer 42. The above Al compositional ratios are examples. As long as Al compositional ratio decreases from bottom to top, they can be another composition.

According to the present embodiment, it is possible to suppress the occurrence of warpage of Si substrate 1 by forming an AlN layer 52a between the C—GaN layer 51a and the C—GaN layer 51b in composite layer 5. Also, cracks into the C—GaN layer 5b and the GaN layer 7 can be suppressed. This will be explained below.

In the unconformity state (the state in which sliding occurred) to the crystal of GaN constituting the C—GaN layer 51a, the AlN constituting the AlN layer 52a is epitaxially grown on the C—GaN layer 51a. On the other hand, the GaN constituting the C—GaN layer 51b and the GaN layer 7 is affected by the crystal of the AlN constituting the AlN layer 52a which is the foundation. That is, GaN constituting the C—GaN layer 51b and the GaN layer 7 is epitaxially grown on the AlN layer 52a, so as to take over the crystal structure of the AlN constituting the AlN layer 52a. The GaN lattice constant is larger than the AlN lattice constant. The lateral lattice constant in FIG. 1 of GaN constituting the GaN layer 51b is smaller than the general lattice constant of GaN (not including compressive strain). In other words, the C—GaN layer 51b and the GaN layer 7 contain compressive strain therein.

At the time of temperature decrease after the C—GaN layer 51b and the GaN layer 7 are formed, the C—GaN layer 51b and the GaN layer 7 receive stress from the AlN layer 52a due to the difference in thermal expansion coefficient between GaN and Si. This stress causes the generation of Si substrate 1 warpage and causes the generation of cracks to the C—GaN layer 51b and the GaN layer 7. However, by the compressive strain introduced into the C—GaN layer 51b and the GaN layer 7 when forming the C—GaN layer 51b and the GaN layer 7, this stress is mitigated. As a result, the occurrence of warpage of Si substrate 1 can be suppressed, and the occurrence of cracks into the C—GaN layer 51b and GaN layer 7 can be suppressed.

Also, compound semiconductor substrate CS1 includes C—GaN layers 51a and 51b, having an insulation breakdown voltage higher than that of GaN, AlN layer 52a, and Al nitride semiconductor layer 4. As a result, it can improve the vertical withstand voltage of the compound semiconductor substrate.

Also, according to the present embodiment, compound semiconductor substrate CS1 includes Al nitride semiconductor layer 4 between AlN buffer layer 3 and C—GaN layer 51a in composite layer 5. Therefore, the difference between the lattice constant of Si and the lattice constant of GaN can be mitigated. The lattice constant of Al nitride semiconductor layer 4 is between the lattice constant of Si and the lattice constant of GaN. As a result, the crystal quality of the C—GaN layers 51a and 51b can be improved. Also, the occurrence of Si substrate 1 warpage can be suppressed. The generation of cracks into the C—GaN layers 51a and 51b can be suppressed.

Further, according to the present embodiment, as described above, the generation of warpage of Si substrate 1 and the generation of cracks into C—GaN layer 51b and GaN layer 7 are suppressed. Therefore, the GaN layer 7 can be thickened.

In addition, compound semiconductor substrate CS1 includes C—GaN layers 51a and 51b and SiC layer 2 as a foundation layer of GaN layer 7. The lattice constant of SiC is closer to the lattice constant of GaN, as compared with the lattice constant of Si. For this reason, by C—GaN layers 51a and 51b and a GaN layer 7 formed on the SiC layer 2, the crystal quality of the C—GaN layers 51a and 51b, and the GaN layer 7 can be improved.

As described above, according to the present embodiment, by separating the functions of each of Al nitride semiconductor layer 4, composite layer 5, and SiC layer 2, it can increase the effects of suppressing the occurrence of warpage of Si substrate 1, suppressing the generation of cracks into the C—GaN layer 51b and the GaN layer 7, improving withstand voltage of the compound semiconductor substrate CS1, and improving the crystal quality of the C—GaN layers 51a and 51b and the GaN layer 7. In particular, in the present embodiment, making SiC layer 2 the foundation layer largely contributes the improvement of the crystal quality of the GaN layer 7.

According to the present embodiment, there is a SiC layer 2 and the crystal quality of the C—GaN layers 51a and 51b and the GaN layer 7 is improved. Hence, the thickness of the AlN layer in the composite layer 5 can be reduced. The occurrence of warpage and cracks can be suppressed more efficiently. In addition, there is a SiC layer 2 and the crystal quality of the C—GaN layer 51a is improved. Since the C—GaN layers 51a and 51b and the GaN layer 7 can be thickened, withstand voltage can be more improved. The performance of the HEMT can also be improved.

Second Embodiment

Figure 3:
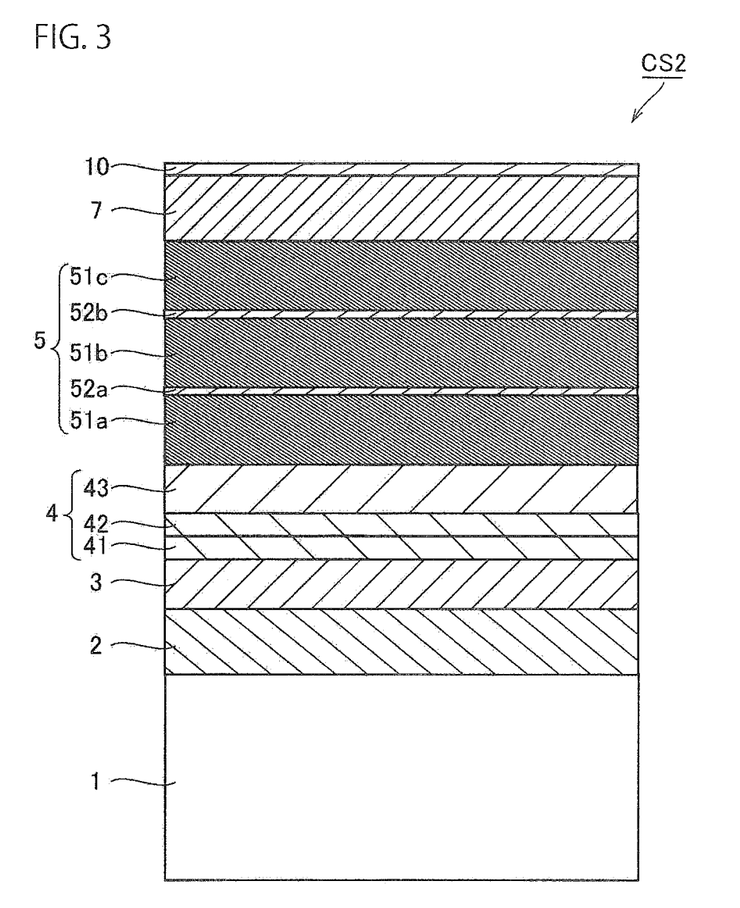
FIG. 3 is a cross-sectional view showing the configuration of compound semiconductor substrate CS2 in the second embodiment of the present invention.

FIG. 3 is a cross-sectional view showing the configuration of compound semiconductor substrate CS2 in the second embodiment of the present invention.

Referring to FIG. 3, as compared to the compound semiconductor substrate CS1 in the first embodiment, the compound semiconductor substrate CS2 in the present embodiment is different in the internal configuration of the composite layer 5. Specifically, the composite layer 5 in the present embodiment includes three C—GaN layers 51a, 51b and 51c (an example of a plurality of first layers) as a C—GaN layer, and two AlN layers 52a and 52b (an example of a second layer). The C—GaN layer 51a is the lowest layer among the layers constituting the composite layer 5, and is in contact with the Al nitride semiconductor layer 4. The AlN layer 52a is formed on the C—GaN layer 51a and in contact with the C—GaN layer 51a. The C—GaN layer 51b is formed on the AlN layer 52a and in contact with the AlN layer 52a. The AlN layer 52b is formed on the C—GaN layer 51b and in contact with the C—GaN layer 51b. The C—GaN layer 51c is formed on the AlN layer 52b and in contact with the AlN layer 52b. The C—GaN layer 51c is the uppermost layer among the layers constituting the composite layer 5, and is in contact with the GaN layer 7.

The configurations of compound semiconductor substrate CS2 other than the above are the same as the configurations of compound semiconductor substrate CS1 in the first embodiment. The same members are denoted by the same reference numerals, and the description thereof will not be repeated.

According to this embodiment, the same effect as that of the first embodiment can be obtained. In addition, as there are two AlN layers 52a and 52b in the composite layer 5, the effect of providing compressive strain to the upper GaN layers 51b and 51c and the GaN layer 7 is increased. As a result, it is possible to suppress the occurrence of warpage of Si substrate 1. The generation of cracks into the C—GaN layers 51a, 51b and 51c, and the GaN layer 7 can be suppressed.

Also, there are two AlN layers 52a and 52b in the composite layer 5. This can improve the vertical withstand voltage of the compound semiconductor substrate.

[Modification]

In the modification, the configuration of modification of Al nitride semiconductor layer 4 in each of compound semiconductor substrates CS1 and CS2 will be described.

Figure 4:
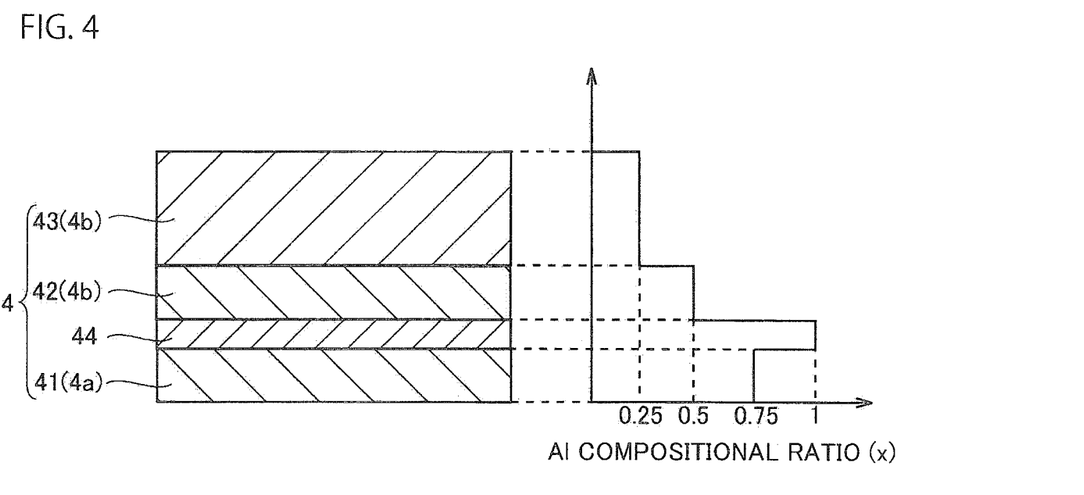
FIG. 4 is a view showing the distribution of Al compositional ratio inside Al nitride semiconductor layer 4 in the first modification of the present invention.

FIG. 4 is a diagram showing the distribution of Al compositional ratio inside Al nitride semiconductor layer 4 in the first modification of the present invention.

Referring to FIG. 4, Al nitride semiconductor layer 4 in this modification includes AlGaN layer 4a (an example of the first nitride semiconductor layer), AlN intermediate layer 44 (an example of the second nitride semiconductor layer), and AlGaN layer 4b (an example of the third nitride semiconductor layer).

The AlGaN layer 4a is formed on the AlN buffer layer 3, being in contact with the AlN buffer layer 3. The AlGaN layer 4a is made of $Al_{0.75}Ga_{0.25}N$ layer 41 (an AlGaN layer in which the compositional ratio of Al is 0.75). The compositional ratio of Al inside the AlGaN layer 4a is constant.

The AlN intermediate layer 44 is formed on the AlGaN layer 4a. The bottom surface of the AlN intermediate layer 44 is in contact with the top surface of the AlGaN layer 4a, and the top surface of the AlN intermediate layer 44 is in contact with the bottom surface of the AlGaN layer 4b.

The AlGaN layer 4b is formed on the AlN intermediate layer 44. The compositional ratio of Al inside the AlGaN layer 4b decreases from the bottom to the top. The AlGaN layer 4b is configured by $Al_{0.5}Ga_{0.5}N$ layer 42 (an AlGaN layer in which the compositional ratio of Al is 0.5), and $Al_{0.25}Ga_{0.75}N$ layer 43 (an AlGaN layer in which the compositional ratio of Al is 0.25) formed on the $Al_{0.5}Ga_{0.5}N$ layer 42, being in contact with the $Al_{0.5}Ga_{0.5}N$ layer 42.

Figure 5:
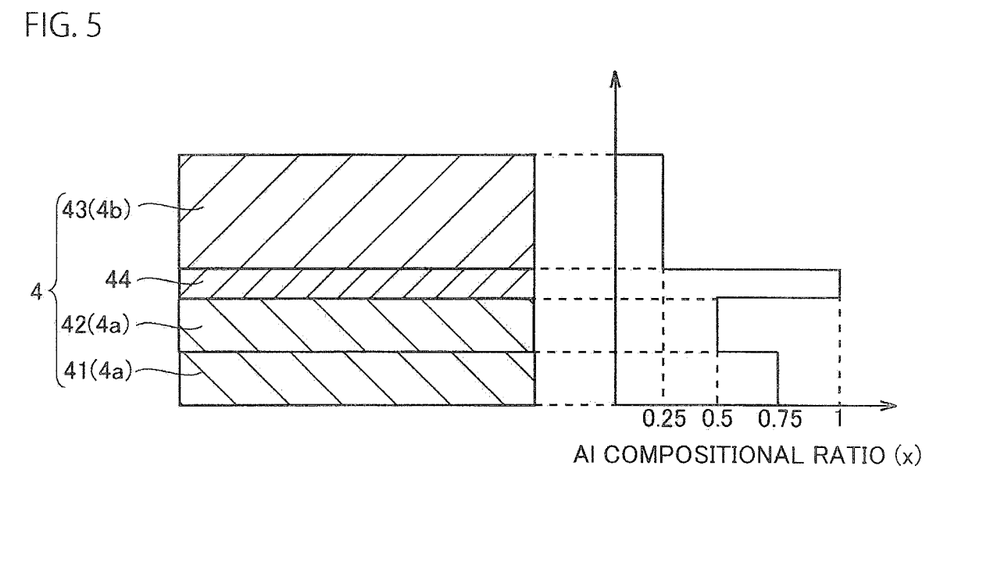
FIG. 5 is a view showing the distribution of Al compositional ratio inside Al nitride semiconductor layer 4 in the second modification of the present invention.

FIG. 5 is a diagram showing the distribution of the Al compositional ratio inside Al nitride semiconductor layer 4 in the second modification of the present invention.

Referring to FIG. 5, Al nitride semiconductor layer 4 in this modification includes AlGaN layer 4a (an example of the first nitride semiconductor layer), AlN intermediate layer 44 (an example of the second nitride semiconductor layer), and AlGaN layer 4b (an example of the third nitride semiconductor layer).

The AlGaN layer 4a is formed on the AlN buffer layer 3, being in contact with the AlN buffer layer 3. The compositional ratio of Al inside the AlGaN layer 4a decreases from the bottom toward the top. The AlGaN layer 4a is configured by $Al_{0.75}Ga_{0.25}N$ layer 41 (an AlGaN layer in which the compositional ratio of Al is 0.75), and $Al_{0.5}Ga_{0.5}N$ layer 42

(an AlGaN layer in which the compositional ratio of Al is 0.5) formed on the $Al_{0.75}Ga_{0.25}N$ layer 41, being in contact with the $Al_{0.75}Ga_{0.25}N$ layer 41.

The AlN intermediate layer 44 is formed on the AlGaN layer 4a. The bottom surface of the AlN intermediate layer 44 is in contact with the top surface of the AlGaN layer 4a, and the top surface of the AlN intermediate layer 44 is in contact with the bottom surface of the AlGaN layer 4b.

The AlGaN layer 4b is formed on the AlN intermediate layer 44. The AlGaN layer 4b is made of $Al_{0.25}Ga_{0.75}N$ layer 43 (an AlGaN layer in which the compositional ratio of Al is 0.25). The compositional ratio of Al inside the AlGaN layer 4b is constant.

The configurations other than the above in each of the compound semiconductor substrates of the first and the second modification are the same as the configurations in the above-mentioned embodiments. Therefore, the description will not be repeated.

The AlN intermediate layer 44 functions to generate compressive strain in the AlGaN layer 4b. By providing the AlN intermediate layer 44, according to the first and second modification, warpage and cracks are further suppressed.

EXAMPLES

The inventors of the present invention manufactured substrates of the invention examples 1 and 2 and the comparative examples having the configurations described below as samples.

The Invention Example 1

The inventors of the present invention manufactured compound semiconductor substrate CS1 shown in FIG. 1. The thickness of each of the C—GaN layers 51a and 51b was set to 1450 nanometers, and the thickness of the AlN layer 52a was set to 15 nanometers. The average carbon concentration of each of the C—GaN layers 51a and 51b was set to a value within the range of $1*10^{19}/cm^3$ or more and $2*10^{19}/cm^3$ or less.

The Invention Example 2

The inventors of the present invention manufactured compound semiconductor substrate CS2 shown in FIG. 3. The thickness of each of the C—GaN layers 51a, 51b, and 51c was set to 967 nanometers, and the thickness of each of the AlN layers 52a and 52b was set to 15 nanometers. The average carbon concentration of each of the C—GaN layers 51a, 51b, and 51c was set to a value within the range of $1*10^{19}/cm^3$ or more and $2*10^{19}/cm^3$ or less.

Comparative Example

Figure 6:
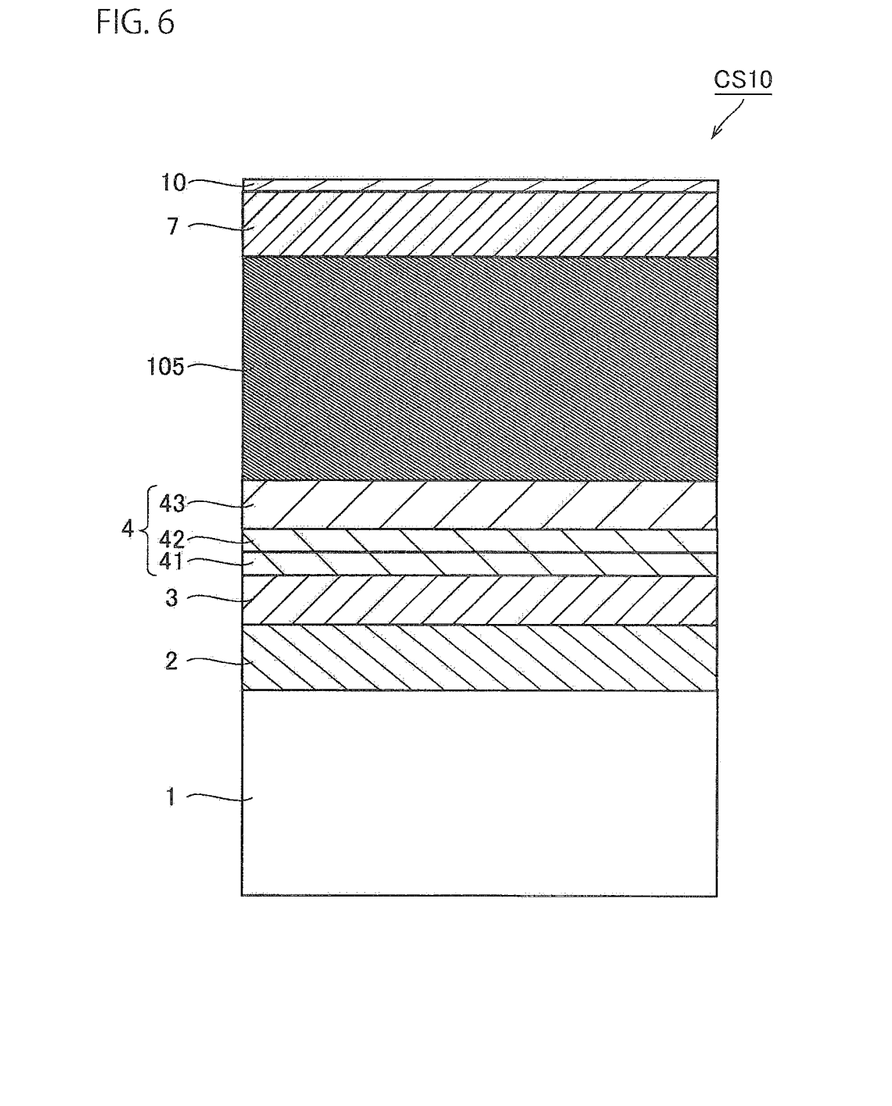
FIG. 6 is a cross-sectional view showing the configuration of a comparative example (compound semiconductor substrate CS10), according to an embodiment of the present invention.

The inventors of the present invention manufactured compound semiconductor substrate CS10 shown in FIG. 6. The compound semiconductor substrate CS10 is different from compound semiconductor substrate CS1 (The Invention Example 1), in that the C—GaN layer 105 is formed instead of composite layer 5. The configuration of compound semiconductor substrate CS10 other than this is the same as compound semiconductor substrate CS1 (The Invention Example 1). The average carbon concentration of the C—GaN layer 105 was set to a value within the range of $1*10^{19}/cm^3$ or more and $2*10^{19}/cm^3$ or less.

For each samples obtained, the inventors of the present invention performed confirmation of the cracks occurrence visual inspection, warpage quantity measurement, and measurement of vertical withstand voltage (withstand voltage in the thickness direction of the compound semiconductor substrate).

Figure 7:
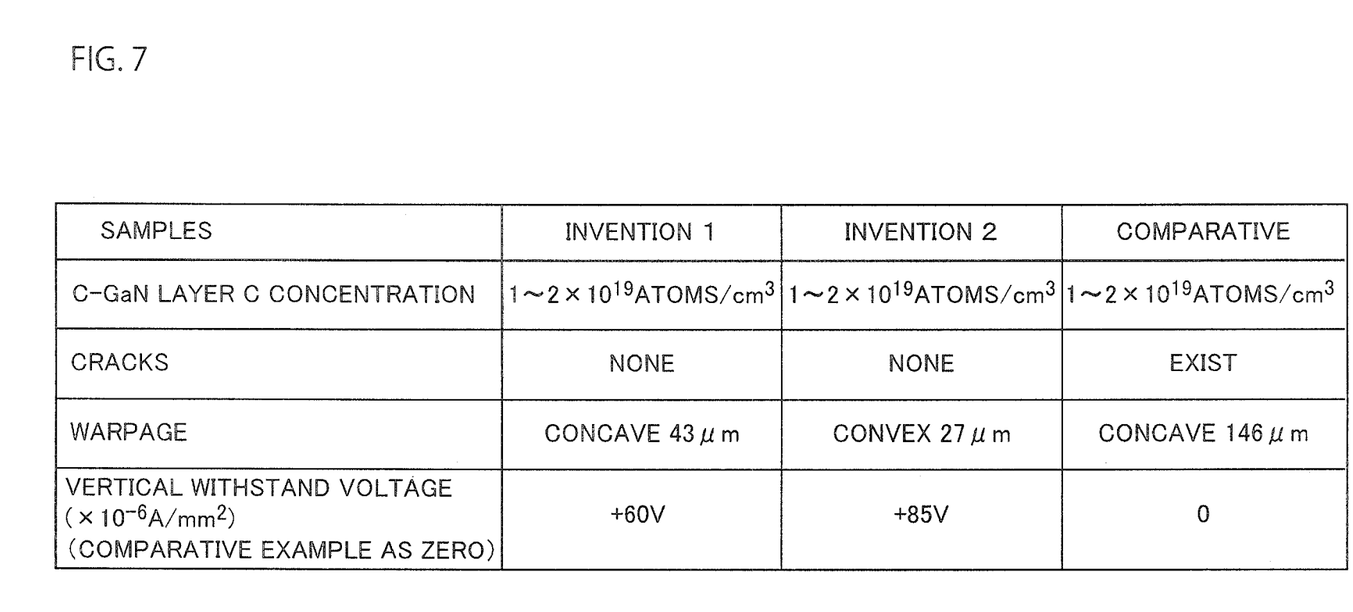
FIG. 7 shows a table showing an evaluation result of each sample in an embodiment of the present invention.

FIG. 7 is a table showing the evaluation results of each sample in examples of the present invention. In FIG. 7, as vertical withstand voltages, the values are shown when the vertical withstand voltage of the comparative example is used as the reference (zero). Also, when the Si substrate in the compound semiconductor substrate is placed on the lower side and warpage occurs so as to be convex, the word "convex" is denoted as the warpage amount. When the Si substrate in the compound semiconductor substrate is placed on the lower side and warpage occurs so as to be concave, the word "concave" is denoted.

Referring to FIG. 7, while the occurrence of cracks was observed in the comparative example, the occurrence of cracks was not observed in the invention examples 1 and 2. Also, in the comparative example, the concave shape has a large warpage amount of 146 micrometers. On the other hand, in the invention example 1, the concave shape has a small warpage amount of 43 micrometers. Furthermore, in the invention example 2, the convex shape has a warpage amount of 27 micrometers. The convex warpage of invention example 2 is attributed to the large compressive strain of the C—GaN layer in compound semiconductor substrate. This shows that the effect of suppressing the occurrence of cracks is large. From these results, in the invention examples 1 and 2, it can be seen that the occurrence of cracks is suppressed, and warpage of the substrate is improved, as compared to the comparative example.

Figure 8:
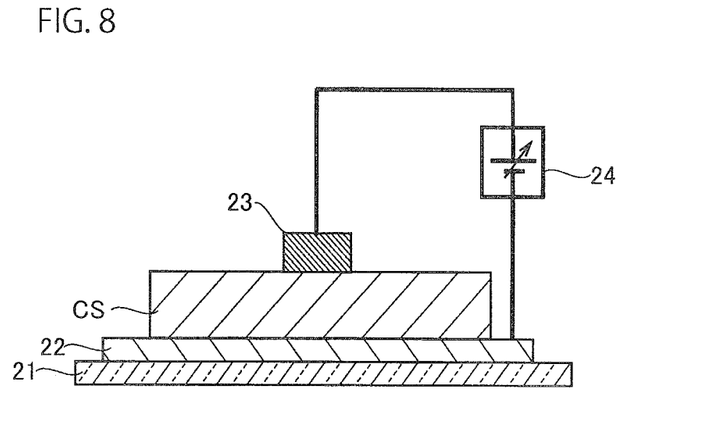
FIG. 8 is a cross-sectional view showing a measuring method of vertical withstand voltage in an embodiment of the present invention.

FIG. 8 is cross-sectional view showing a measuring method of vertical withstand voltage in an embodiment of the present invention.

Referring to FIGS. 7 and 8, the compound semiconductor substrate CS of the sample to be measured was fixed on copper plate 22 pasted on glass plate 21. On Al nitride semiconductor layer 10 of the fixed compound semiconductor substrate CS, the electrode 23 made of Al was provided to contact the Al nitride semiconductor layer 10. One terminal of curve tracer 24 is connected to copper plate 22. The other terminal is connected to electrode 23. Using curve tracer 24, voltage was applied between copper plate 22 and electrode 23. The density of the current flowing between copper plate 22 and electrode 23 (current flowing longitudinally through the sample) was measured. When the measured current density reaches $1*10^{-6}$ $A/mm^2$, it was considered that the sample had breakdown. The voltage between copper plate 22 and electrode 23 at this time was measured as withstand voltage.

As a result of the measurement, according to the invention example 1, the vertical withstand voltage was increased by 60V as compared with the comparative example. According to the invention example 2, the vertical withstand voltage was increased by 85V as compared with the comparative example. From these results, according to the invention examples 1 and 2, it can be seen that the vertical withstand voltage is improved, as compared to the comparative example.

[Other]

The above embodiments and modifications can be combined as appropriate.

The embodiments described above, modification, and the examples should be considered in all respects as illustrative and not restrictive. The scope of the present invention is shown not by the above descriptions but by the scope of claims and is intended to include all modifications within the scope and meaning equivalent to the scope of claims.

EXPLANATION OF REFERENCE NUMERALS

1: Si (silicon) substrate
2: SiC (silicon carbide) layer
3: AlN (aluminum nitride) buffer layer
4, 10: Al (Aluminum) nitride semiconductor layer
4a, 4b: AlGaN (aluminum nitride gallium) layer
5: composite layer
7: GaN (gallium nitride) layer
21: glass plate
22: copper plate
23: electrode
24: curve tracer
41: $Al_{0.75}Ga_{0.25}N$ layer
42: $Al_{0.5}Ga_{0.5}N$ layer
43: $Al_{0.25}Ga_{0.75}N$ layer
44: AlN intermediate layer
51a, 51b, 51c, 105: C (carbon)-GaN layer
52a, 52b: AlN layer
CS, CS1, CS2, CS10: compound semiconductor substrate

What is claimed is:

1. A compound semiconductor substrate comprising:
a Si substrate,
a SiC layer formed on the Si substrate,
a buffer layer consisting of AlN, formed on the SiC layer,
a nitride semiconductor layer containing Al formed on the buffer layer,
a composite layer formed on the nitride semiconductor layer,
an electron transition layer consisting of GaN, formed on the composite layer, and
a barrier layer formed on the electron transition layer, wherein
the composite layer includes a plurality of first layers, being stacked in a vertical direction, consisting of GaN including carbon, and a second layer consisting of AlN formed between the plurality of the first layers,
each of the first layers in the plurality of the first layers has a thickness of 550 nanometers or more and 2000 nanometers or less,
wherein the second layer contacts two of the plurality of the first layers between which the second layer is located.

2. The compound semiconductor substrate according to claim 1, wherein
each of the first layers in the plurality of the first layers has an average carbon atomic concentration of $1*10^{18}$ $atoms/cm^3$ or more and $1*10^{21}$ $atoms/cm^3$ or less.

3. The compound semiconductor substrate according to claim 1, wherein
the second layer has a thickness of 10 nanometers or more and 15 nanometers or less.

4. The compound semiconductor substrate according to claim 1, wherein
the compositional ratio of Al inside the nitride semiconductor layer decreases from a bottom to a top.

5. The compound semiconductor substrate according to claim 1, wherein the nitride semiconductor layer includes
a first nitride semiconductor layer including Al and Ga,
a second nitride semiconductor layer containing Al formed on the first nitride semiconductor layer, being in contact with the first nitride semiconductor layer, and
a third nitride semiconductor layer including Al and Ga formed on the second nitride semiconductor layer, being in contact with the second nitride semiconductor layer, wherein
the compositional ratio of Al inside at least one of the first and the third nitride semiconductor layers decreases from a bottom to a top.

6. The compound semiconductor substrate according to claim 1, wherein
a first layer, in the plurality of the first layers, is formed on the second layer and includes a compressive strain.

7. The compound semiconductor substrate according to claim 1, wherein
the nitride semiconductor layer has a thickness of 900 nanometers or more and 2 micrometers or less.

* * * * *